US012635248B2

(12) United States Patent
Wang et al.

(10) Patent No.: US 12,635,248 B2
(45) Date of Patent: May 19, 2026

(54) ARRAY SUBSTRATE, DISPLAY PANEL AND METHOD FOR MANUFACTURING ARRAY SUBSTRATE

(71) Applicant: BOE TECHNOLOGY GROUP CO., LTD., Beijing (CN)

(72) Inventors: Chaolu Wang, Beijing (CN); Liuqing Li, Beijing (CN); Feng Guan, Beijing (CN); Meng Zhao, Beijing (CN); Jinchao Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 361 days.

(21) Appl. No.: 18/262,462

(22) PCT Filed: Sep. 27, 2022

(86) PCT No.: PCT/CN2022/121729
§ 371 (c)(1),
(2) Date: Jul. 21, 2023

(87) PCT Pub. No.: WO2024/065176
PCT Pub. Date: Apr. 4, 2024

(65) Prior Publication Data
US 2024/0395831 A1 Nov. 28, 2024

(51) Int. Cl.
*H10D 86/60* (2025.01)
*H10D 86/01* (2026.01)
*H10D 86/40* (2025.01)

(52) U.S. Cl.
CPC ........... *H10D 86/60* (2025.01); *H10D 86/021* (2025.01); *H10D 86/451* (2025.01); *H10D 86/421* (2025.01)

(58) Field of Classification Search
None
See application file for complete search history.

(56) References Cited

U.S. PATENT DOCUMENTS

2014/0103351 A1 4/2014 Liu et al.
2016/0254287 A1 9/2016 Wang et al.
(Continued)

FOREIGN PATENT DOCUMENTS

CN 104218094 A 12/2014
CN 107452749 A 12/2017
(Continued)

*Primary Examiner* — Bo B Jang
(74) *Attorney, Agent, or Firm* — Raj S. Davé; Davé Law Group, LLC

(57) ABSTRACT

The disclosure relates to an array substrate, a display panel, and a method for manufacturing an array substrate. The array substrate includes a first active layer on a substrate; a second active layer on a side of the first active layer away from the substrate; an intermediate layer between the first and second active layers and including a first via arriving at the first active layer, wherein the second active layer includes first, second and third sub-active layers, the first sub-active layer extending around a perimeter of the first via and in a direction away from the first via, the second sub-active layer covering a side wall of the first via, the third sub-active layer being at a bottom of the first via and covering a portion of a surface of the second active layer exposed by the first via, and wherein the second active layer is continuous.

18 Claims, 7 Drawing Sheets

(56) References Cited

U.S. PATENT DOCUMENTS

| | | | |
|---|---|---|---|
| 2017/0294456 A1 | 10/2017 | Lee et al. | |
| 2019/0333944 A1 | 10/2019 | Xiao et al. | |
| 2024/0153959 A1* | 5/2024 | Luo ..................... | H10D 86/021 |

FOREIGN PATENT DOCUMENTS

| | | | |
|---|---|---|---|
| CN | 114373771 A | 4/2022 | |
| CN | 114628409 A | 6/2022 | |
| CN | 114823914 A | 7/2022 | |
| KR | 20150033772 A | 4/2015 | |

* cited by examiner

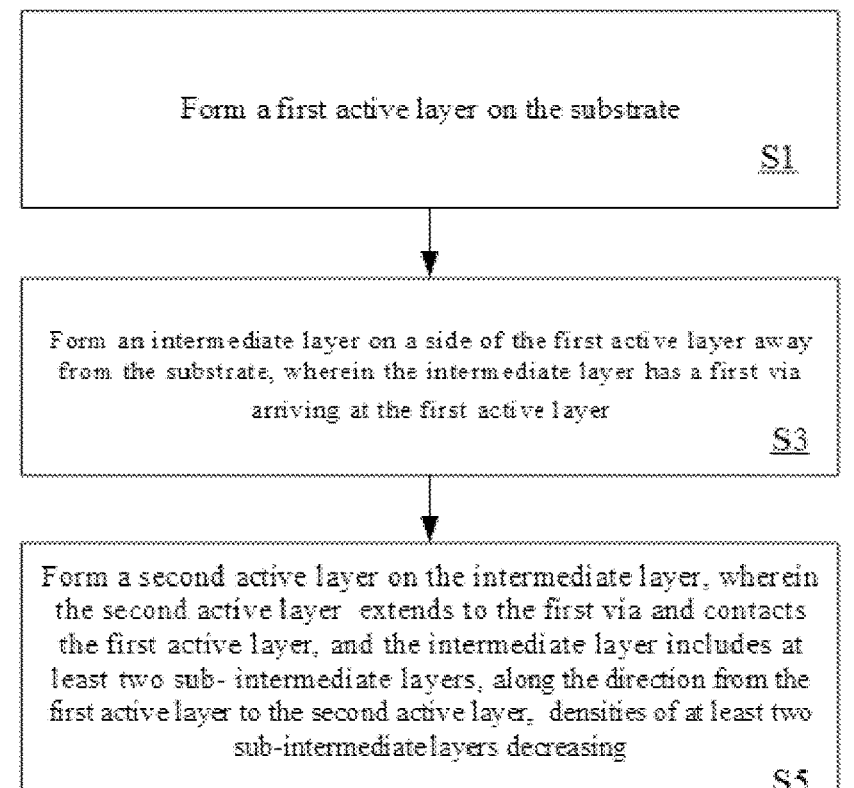
FIG. 7
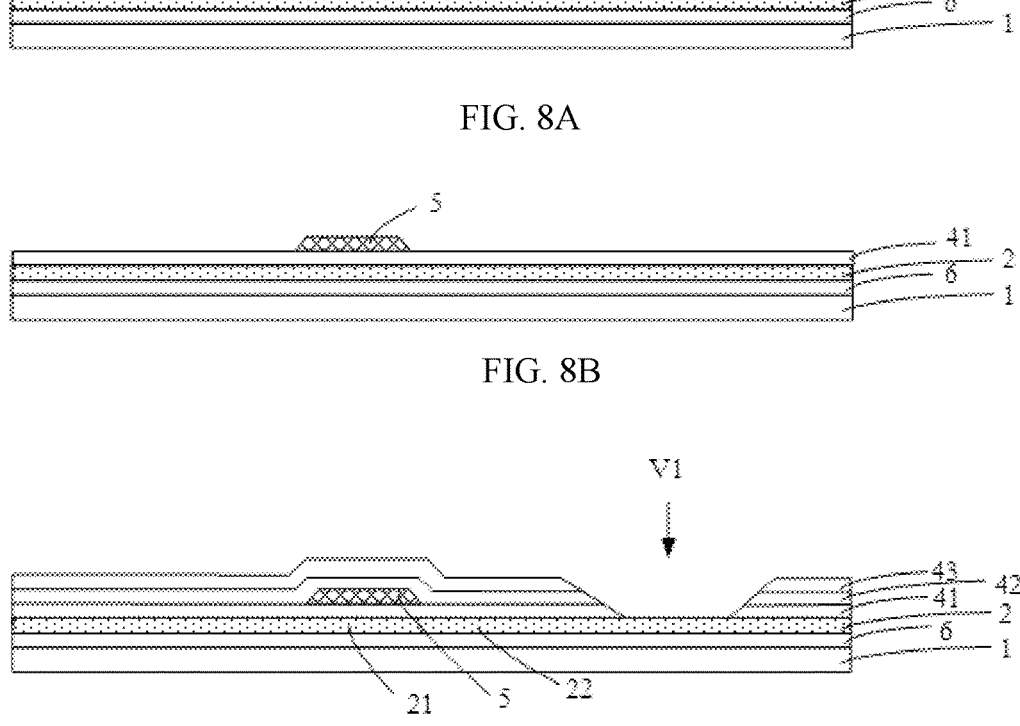
FIG. 8A
FIG. 8B
FIG. 8C (a)                                   (b)

(a)                    (b)

(a)                    (b)

(a)                    (b)

(a)　　　　　　　　　　(b)

(a)　　　　　　　　　　(b)

ARRAY SUBSTRATE, DISPLAY PANEL AND METHOD FOR MANUFACTURING ARRAY SUBSTRATE

CROSS REFERENCE TO RELATED APPLICATIONS

This patent application is a National Stage Entry of PCT/CN2022/121729 filed on Sep. 27, 2022, the disclosure of which is incorporated by reference herein in its entirety as part of the present application.

TECHNICAL FIELD

This disclosure relates to a field of display technology. More specifically, it relates to an array substrate, display panel and a method for manufacturing an array substrate.

BACKGROUND

In high PPI array substrate design, the pixel pitch is small and the layout is tight, making it difficult to place vias. Moreover, for through holes, such as, metal through holes, in addition to the size of the through hole itself, it is also necessary to consider the subsequent layers to wrap an edge of the through hole and other wires alignment avoidance, which actually occupies a large area of the layout. Therefore, the development of double-layer low temperature polysilicon (LTPS) lapping structure is important to achieve high PPI of array substrate and TFT design of subsequent stacked layers.

SUMMARY

Some embodiments of the disclosure provide an array substrate. The array substrate includes a substrate; a first active layer on the substrate; a second active layer on a side of the first active layer away from the substrate;

an intermediate layer between the first active layer and the second active layer, wherein the intermediate layer includes a first via arriving at the first active layer, wherein the second active layer includes a first sub-active layer, a second sub-active layer and a third sub-active layer, the first sub-active layer extending around a perimeter of the first via and in a direction away from the first via, the second sub-active layer covering a side wall of the first via, the third sub-active layer being at a bottom of the first via and covering a portion of a surface of the second active layer exposed by the first via, and wherein the second active layer is continuous.

In some embodiments, the intermediate layer includes at least two sub-intermediate layers, and wherein an angle between a sub-intermediate layer of the at least two sub-intermediate layers further away from the substrate and the first active layer is smaller than an angle between a sub-intermediate layer of the at least two sub-intermediate layers closer to the substrate and the first active layer.

In some embodiments, the intermediate layer includes at least two sub-intermediate layers, and wherein an angle between a sub-intermediate layer of the at least two sub-intermediate layers further away from the substrate and the first active layer is equal to an angle between a sub-intermediate layer of the at least two sub-intermediate layers closer to the substrate and the first active layer.

In some embodiments, the first active layer includes polysilicon, and wherein the second active layer includes polysilicon.

In some embodiments, the first active layer includes a first channel region and a first source/drain region disposed on either side of the first channel region, and wherein the second active layer includes a second channel region and a second source/drain region disposed on either side of the second channel region, and wherein the first source/drain region is connected to the second source/drain region through the via.

In some embodiments, the array substrate further includes a first gate electrode on the first active layer, wherein the intermediate layer includes: a first insulating layer between the first active layer and the first gate electrode; a second insulating layer on a surface of the first gate electrode away from the substrate, wherein the second insulating layer further covers a portion, exposed by the first gate electrode, of a surface of the first insulating layer away from the substrate; a buffer layer on a surface of the second insulating layer away from the substrate.

In some embodiments, at least one of the first insulating layer, the second insulating layer and the buffer layer includes at least two sublayers, the at least two sublayers having decreasing densities in a direction from the first active layer to the second active layer.

In some embodiments, the first insulating layer satisfies one of the following: the first insulating layer includes a first sub-insulating layer, or the first insulating layer includes a first sub-insulating layer and a second sub-insulating layer on a surface of the first sub-insulating layer away from the substrate; the buffer layer satisfies one of the following: the buffer layer includes a first sub-buffer layer, or the buffer layer includes a first sub-buffer layer and a second sub-buffer layer on a surface of the first sub-buffer layer of the silicon nitride away from the substrate.

In some embodiments, the second insulating layer includes silicon nitride with a thickness ranging from 800 Å to 2000 Å; in case the first insulating layer includes a first sub-insulating layer, the first sub-insulating layer includes silicon oxide with a thickness ranging from 1000 Å to 1500 Å; in case the first insulating layer includes the first sub-insulating layer and the second sub-insulating layer, the first sub-insulating layer includes silicon oxide with a thickness ranging from 500 Å to 1000 Å, and the second sub-insulating layer includes silicon nitride with a thickness ranging from 400 Å to 600 Å; and wherein in case the buffer layer includes a first sub-buffer layer, the first sub-buffer layer includes silicon oxide with a thickness ranging from 3000 Å to 4000 Å, and in case the buffer layer includes a first sub-buffer layer and the second sub-buffer layer, the first sub-buffer layer includes silicon oxide with a thickness ranging from 500 Å to 1000 Å, and the second sub-buffer layer includes silicon nitride with a thickness ranging from 400 Å to 600 Å.

In some embodiments, the array substrate further includes another buffer layer between the substrate and the first active layer; a third insulating layer on a surface of the second active layer away from the substrate; a first source/drain electrode on a surface of the third insulating layer away from the substrate; a second via in the first insulating layer, the second insulating layer, the buffer layer and the third insulating layer, the second via and the first via being on different sides of the first gate electrode, the second via arriving at the first active layer, the first source/drain electrode extending into the second via and in contact with the first source/drain region; a second gate electrode on a surface of the third insulating layer away from the substrate; an interlayer dielectric layer on a surface of the second gate electrode away from the substrate; a second source/drain electrode on a surface of the interlayer dielectric layer away from the substrate; a third via in the interlayer dielectric layer and the third insulating layer, the third via and the first via being on different sides of the second gate electrode, the third via arriving at the second active layer, the second source/drain electrode extending into the third via and contacting a second source/drain region of the second active layer.

In some embodiments, an angle between a sub-intermediate layer of the at least two sub-intermediate layers closest to the first active layer and the first active layer ranges from 1° to 90°.

In some embodiments, the angle between a sub-intermediate layer of the at least two sub-intermediate layers closest to the first active layer and the first active layer ranges from 45° to 90°.

In some embodiments, the array substrate further includes a display unit and a fourth via on the interlayer dielectric layer, wherein the display unit includes a first electrode, the fourth via extending from the interlayer dielectric layer to the first active layer, the first electrode being connected to the first active layer through the fourth via, and wherein a projection of the first via on the substrate does not overlap with a projection of the fourth via on the substrate.

Some embodiments of the disclosure further provide a display panel. The display panel includes an array substrate as described above.

Some embodiments of the disclosure provide a method for manufacturing an array substrate. The method for manufacturing an array substrate includes forming a first active layer on a substrate; forming an intermediate layer on a side of the first active layer away from the substrate, wherein the intermediate layer has a first via arriving at the first active layer; forming a second active layer on the intermediate layer, wherein the second active layer includes a first sub-active layer, a second sub-active layer and a third sub-active layer, the first sub-active layer extending around a perimeter of the first via and in a direction away from the first via, the second sub-active layer covering a side wall of the first via, the third sub-active layer being at a bottom of the first via and covering a portion of a surface of the second active layer exposed by the first via, and wherein the second active layer is continuous.

In some embodiments, the intermediate layer includes at least two sub-intermediate layers, and wherein an angle between a sub-intermediate layer of the at least two sub-intermediate layers further away from the substrate and the first active layer is smaller than an angle between a sub-intermediate layer of the at least two sub-intermediate layers closer to the substrate and the first active layer.

In some embodiments, the intermediate layer includes at least two sub-intermediate layers, and wherein an angle between a sub-intermediate layer of the at least two sub-intermediate layers further away from the substrate and the first active layer is equal to an angle between a sub-intermediate layer of the at least two sub-intermediate layers closer to the substrate and the first active layer.

In some embodiments, the first active layer includes polysilicon, and wherein the second active layer includes polysilicon.

In some embodiments, the first active layer includes a first channel region and a first source/drain region disposed on either side of the first channel region, and wherein the second active layer includes a second channel region and a second source/drain region disposed on either side of the second channel region, and wherein the first source/drain region is connected to the second source/drain region through the via.

In some embodiments, the method for manufacturing an array substrate further includes forming a first gate electrode on the first active layer, wherein forming the intermediate layer includes: forming a first insulating layer between the first active layer and the first gate electrode; forming a second insulating layer on a surface of the first gate electrode away from the substrate, wherein the second insulating layer further covers a portion, exposed by the first gate electrode, of a surface of the first insulating layer away from the substrate; and forming a buffer layer on a surface of the second insulating layer away from the substrate.

In some embodiments, forming the first insulating layer, forming the second insulating layer and the buffer layer includes controlling the densities by controlling at least one of deposition temperature and deposition power.

In some embodiments, at least one of the first insulating layer, the second insulating layer and the buffer layer includes at least two sublayers, wherein for two adjacent sublayers of the at least two sublayers, at least one of the deposition temperature and deposition power corresponding to the sublayer further away from the substrate is less than at least one of the deposition temperature and the deposition power corresponding to the sublayer closer to the substrate.

In some embodiments, forming the first active layer and forming the intermediate layer includes: forming a first amorphous silicon layer on the substrate; annealing the first amorphous silicon layer to convert the first amorphous silicon layer to a first polycrystalline silicon layer; performing a first doping on the first polysilicon layer to form a first polysilicon layer that has been first doped; forming a first insulating layer on a side, away from the substrate, of the first polysilicon layer that has been first doped; forming a first gate electrode on a side of the first insulating layer away from the substrate; performing a second doping on the first polysilicon layer that has been first doped to form the first active layer, wherein a doping concentration of the second doping is greater than a doping concentration of the first doping; forming a second insulating material layer on the first gate electrode; forming a first buffer layer on the second insulating layer; and patterning the first buffer layer, the second insulating layer and the first insulating layer to form the first via.

In some embodiments, the method for manufacturing an array substrate further includes: forming a second amorphous silicon layer on the first buffer layer; annealing the second amorphous silicon layer to convert the second amorphous silicon layer to a second polysilicon layer; performing a third doping on the second polysilicon layer; forming a third insulating layer on the second polysilicon layer; forming a second gate electrode on the third insulating layer; and using the second gate electrode as a mask, performing a fourth doping on the polysilicon layer that has been third doped to form the second active layer, wherein a doping concentration of the fourth doping is greater than a doping concentration of the third doping.

In some embodiments, the fourth doping includes doping a portion of the second active layer disposed in the first via.

In some embodiments, the first insulating layer satisfies one of the following: the first insulating layer includes a first sub-insulating layer, or the first insulating layer includes a first sub-insulating layer and a second sub-insulating layer on a surface of the first sub-insulating layer away from the substrate; the buffer layer satisfying one of the following: the buffer layer includes a first sub-buffer layer, or the buffer layer includes a first sub-buffer layer and a second sub-buffer layer on a surface of the first sub-buffer layer of the silicon nitride away from the substrate.

In some embodiments, the second insulating layer includes silicon nitride with a thickness ranging from 800 Å to 2000 Å; wherein in case the first insulating layer includes a first sub-insulating layer, the first sub-insulating layer including silicon oxide with a thickness ranging from 1000 Å to 1500 Å, wherein in case the first insulating layer includes the first sub-insulating layer and the second sub-insulating layer, the first sub-insulating layer includes silicon oxide with a thickness ranging from 500 Å to 1000 Å, and the second sub-insulating layer includes silicon nitride with a thickness ranging from 400 Å to 600 Å; and wherein in case the buffer layer includes a first sub-buffer layer, the first sub-buffer layer includes silicon oxide with a thickness ranging from 3000 Å to 4000 Å, and in case the buffer layer includes the first sub-buffer layer and the second sub-buffer layer, the first sub-buffer layer includes silicon oxide with a thickness ranging from 500 Å to 1000 Å, and the second sub-buffer layer includes silicon nitride with a thickness ranging from 400 Å to 600 Å.

In some embodiments, an angle between a sub-layer of the at least two sub-intermediate layers closest to the first active layer and the first active layer ranges from 1° to 90°.

In some embodiments, the angle between a sub-layer of the at least two sub-intermediate layers closest to the first active layer and the first active layer ranges from 45° to 90°.

In some embodiments, the method for manufacturing an array substrate further including: forming an interlayer dielectric layer on the second gate; forming a display unit on the interlayer dielectric layer, wherein the display unit includes a first electrode; and forming a fourth via, wherein the fourth via extends from the interlayer dielectric layer to the first active layer, the first electrode being connected to the first active layer through the fourth via, and wherein a projection of the first via on the substrate does not overlap with a projection of the fourth via on the substrate.

BRIEF DESCRIPTION OF THE DRAWINGS

To describe the technical solutions in the embodiments of the present disclosure more clearly, the accompanying drawings of the embodiments are briefly described below. It should be understood that the drawings described below refer only to some embodiments of the present disclosure, and not to restrict the present disclosure, wherein:

FIG. 7 is a schematic view of a method for manufacturing an array substrate according to some embodiments of the disclosure;

FIGS. 8A-FIG. 8G are schematic views of a method for manufacturing an array substrate according to some embodiments of the disclosure.

DETAILED DESCRIPTION

Figure 1:
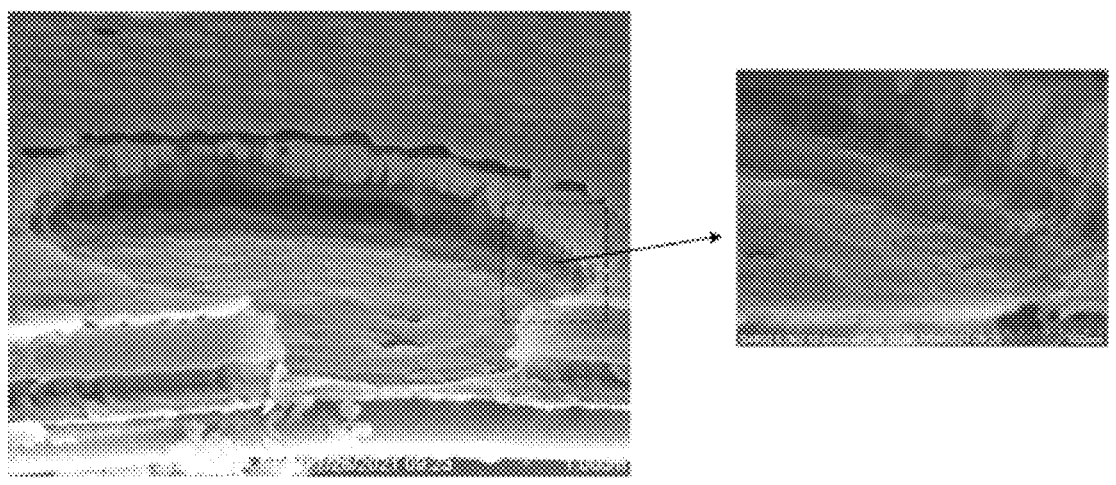
FIG. 1 is a local scanning electron microscope (SEM) image of an array substrate according to one technique.

In order to make the objectives, technical solutions and advantages of the embodiments of the present disclosure more comprehensible, the technical solutions of the embodiments of the present disclosure are clearly and completely described below with reference to the accompanying drawings. Obviously, the described embodiments are only a part but not all of the embodiments of the present disclosure. Based on the described embodiments of the present disclosure, all other embodiments obtained by those skilled in the art without creative efforts shall also fall within the protection scope of the present disclosure.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively.

For purposes of the description, hereinafter, the terms "upper", "lower", "right", "left", "vertical", "horizontal", "top", "bottom", and derivatives thereof shall relate to the disclosure, as it is oriented in the drawing figures. The terms "overlying", "atop", "positioned on" or "positioned atop" means that a first element, such as a first structure, is present on a second element, such as a second structure, wherein intervening elements, such as an interface structure, e.g., interface layer, may be present between the first element and the second element. The term "contact" means that a first element, such as a first structure, and a second element, such as a second structure, are connected with or without any intermediary elements at the interface of the two elements.

FIG. 1 shows a local scanning electron microscope (SEM) image of an array substrate according to one technique. Excimer Laser Annealing (ELA) is commonly used in low temperature polysilicon processes to treat amorphous silicon to form polysilicon. However, as shown in FIG. 1, the inventors of the disclosure found that there are crystallization anomalies in the amorphous silicon at the lapped over-hole locations of the first active layer and the second active layer, which can affect product yields.

Figure 2:
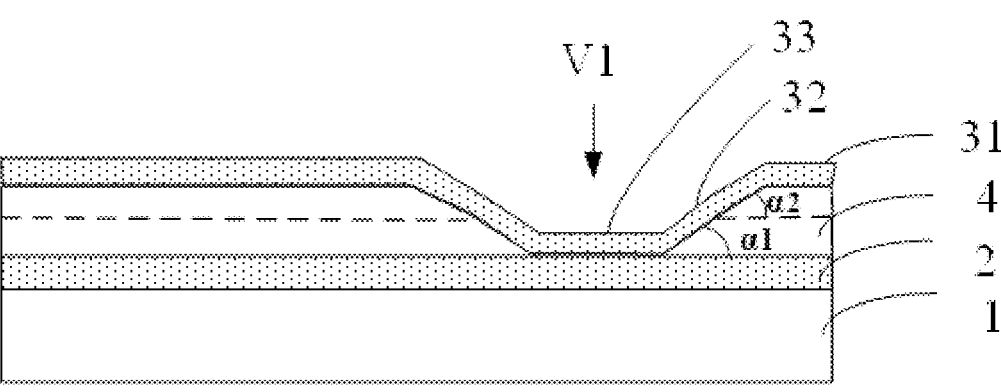
FIG. 2 is a schematic view of an array substrate according to an embodiment of the disclosure.

FIG. 2 shows a schematic view of an array substrate according to an embodiment of the disclosure. As shown in FIG. 2, the array substrate according to an embodiment of the present disclosure includes a substrate 1, a first active layer 2 on the substrate 1, a second active layer 3 on a side of the first active layer 2 away from the substrate 1, and an intermediate layer 4 between the first active layer 2 and the second active layer 3. As shown in FIG. 2, the intermediate layer has a first via V1 arriving at the first active layer 2, the second active layer 3 includes a first sub-active layer 31, a second sub-active layer 32, and a third sub-active layer 33. The first sub-active layer 31 extends around a perimeter of the first via V1 and in a direction away from the first via V1, the second sub-active layer 32 covers the side walls of the first via V1, and the third sub-active layer 33 is at the bottom of the first via V1 and covers a portion of the surface of the second active layer 3 exposed by the first via V1. The second active layer 3 is continuous. The above-mentioned problems can be avoided and better product yields can be achieved by such a setup.

It should be noted that expression that the second active layer is "continuous" herein means that the second active layer is formed by a one-step process.

The first active layer 2 may include polysilicon, and the second active layer may also include polysilicon. The array substrate according to an embodiment of the present invention can achieve a continuously adjustable angle α between a sidewall of the first via and the first active layer, which can ensure that the tangent angle (i.e., the angle between the sidewall of the first via and the first active layer) α of the first via is gentler during the subsequent excimer laser annealing (ELA) process, thus providing better crystallization. This provides a better crystallization effect and ensures a better lap between the first active layer and the second active layer. For example, the angle range between a sidewall of the first via V1 and the first active layer can be continuously adjustable from 1° to 90°. For example, the angle between the side wall of the first via and the first active layer ranges from 45° to 90°.

In some embodiments, the intermediate layer 4 may include at least two sublayers. The densities of the at least two sub-intermediate layers may be decreasing along a direction from the first active layer to the second active layer. In some embodiments, as shown in FIG. 2, an angle α2 between the sub-intermediate layer of the at least two sub-intermediate layers further away from the substrate and the first active layer may be less than an angle α1 between the sub-intermediate layer of the at least two sub-intermediate layers closer to the substrate and the first active layer. In other embodiments, for example, as shown in FIG. 4, the angle between a sub-intermediate layer of the at least two sub-intermediate layers further away from the substrate and the first active layer is equal to the angle between a sub-intermediate layer of the at least two sub-intermediate layers closer to the substrate and the first active layer.

The angle between a sub-intermediate layer of the at least two sub-intermediate layers closest to the first active layer and the first active layer ranges from 1° to 90°, for example, from 45° to 90°. For example, the angle α1 between the sub-intermediate layers of the at least two sub-intermediate layers closest to the first active layer and the first active layer may be 1°, 35°, 45°, 52°, 55°, 65°, 76°, 80°, 84° or 90°. The angles between remaining layers of the at least two sub-intermediate layers and the first active layer may also range from 1° to 90°, e.g., between 45° and 90°, for example, may be 1°, 35°, 45°, 52°, 55°, 65°, 76°, 80°, 84° or 90°.

Figure 3A:
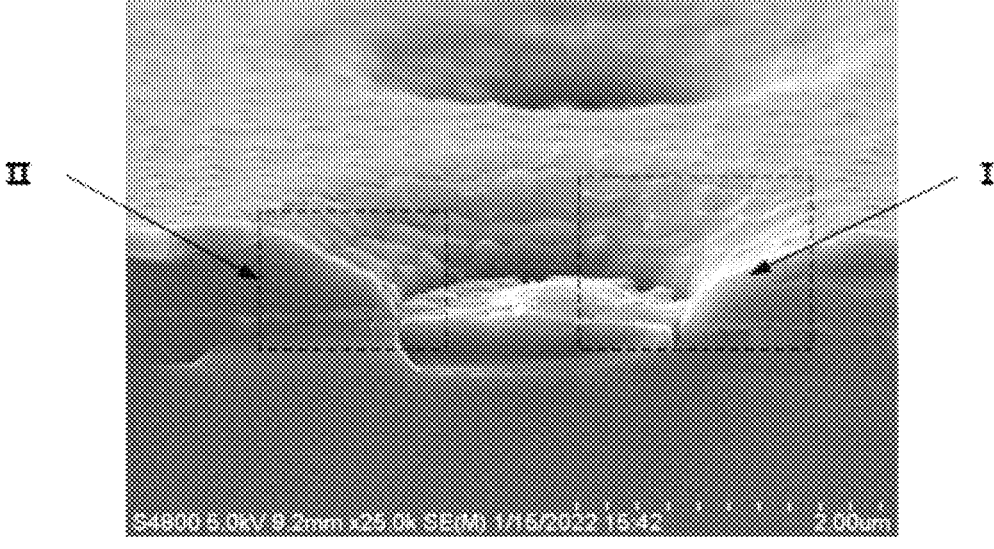
FIGS. 3A-3B are local scanning electron microscopy images of an array substrate according to some embodiments of the disclosure.
Figure 3B:
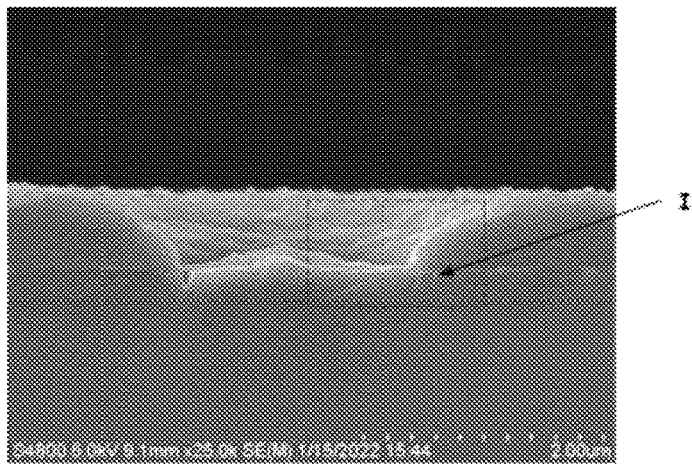

FIGS. 3A-3B show local scanning electron microscopy images of an array substrate according to some embodiments of the disclosure. FIGS. 3A and 3B illustrate the crystallization at the first via, and it can be seen from FIGS. 3A and 3B that distinct grain boundaries and grains can be seen at the sidewalls of the through-hole, especially at region I. Thus, according to some embodiments of the present invention, it is possible to improve the crystallization condition at the through-hole and thus improve the yield rate of the array substrate.

Figure 4:
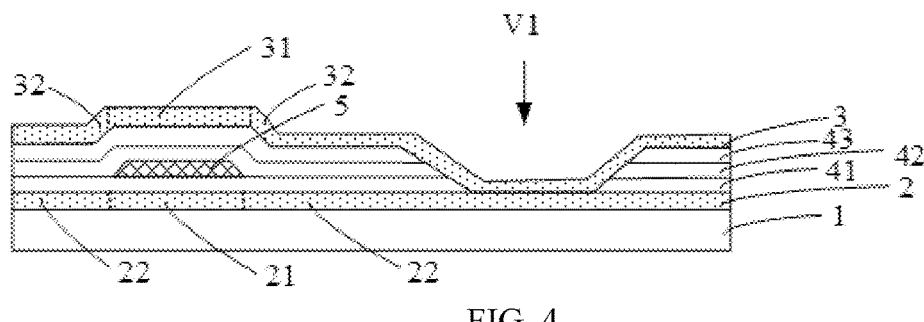
FIG. 4 is a schematic view of an array substrate according to an embodiment of the disclosure.

FIG. 4 shows a schematic view of an array substrate according to an embodiment of the disclosure. As shown in FIG. 4, the first active layer 2 may include a first channel region 21 and a first source/drain region 22 disposed on either side of the first channel region 21, and the second active layer 3 may include a second channel region 31 and a second source/drain region 32 disposed on either side of the second channel region, and wherein the first source/drain region 22 is connected to the second source/drain region 32 through a first via V1.

The array substrate may also include a first gate electrode 5 on the first active layer 2. The intermediate layer may also include a first insulating layer 41 between the first active layer 2 and the first gate electrode 5, a second insulating layer 42 on a surface of the first gate electrode 5 away from the substrate 1, and a buffer layer 43 on a surface of the second insulating layer 42 away from the substrate 1. As shown in FIG. 4, the second insulating layer 42 further covers a portion of a surface of the first insulating layer 41 away from the surface of the substrate 1 that is exposed by the first gate electrode 5.

The density of the first insulating layer 41 can be greater than the density of the second insulating layer 42, and the density of the second insulating layer 42 can be greater than the density of the buffer layer 43. Such arrangement can be easily etched with a gentle climbing angle, which can achieve a better amorphous silicon to polysilicon conversion effect, and thus can better ensure a connection effect of the first active layer and the second active layer.

At least one of the first insulating layer, the second insulating layer and the buffer layer includes at least two sublayers, and the at least two sublayers have decreasing densities in a direction from the first active layer to the second active layer. For example, densities of the formed layers can be controlled by controlling at least one of the deposition temperature and the deposition power. The inventors have found that the quality of the deposited film is closely related to the process parameters such as process temperature, air pressure, gas ratio, and power. The higher the deposition temperature, the less defects in the formed film and the denser the film. The lower the deposition power, the fewer the defects in the formed film, and the denser the film. The transition from dense to sparse film densities can be achieved in a stepwise deposition manner for layers formed from the same material.

In some embodiments, the first insulating layer includes a first sub-insulating layer, the first sub-insulating layer may include silicon oxide SiO with a thickness ranging from 1000 Å to 1500 Å. In other embodiments, the first insulating layer may include a first sub-insulating layer and a second sub-insulating layer on a surface of the first sub-insulating layer away from the substrate, the first sub-insulating layer may include silicon oxide with a thickness ranging from 500 Å to 1000 Å, and the second sub-insulating layer includes silicon nitride with a thickness ranging from 400 Å to 600 Å.

In some embodiments, the buffer layer may include a first sub-buffer layer, for example, the first sub-buffer layer may include silicon oxide with a thickness ranging from 3000 Å to 4000 Å. In other embodiments, the buffer layer may include a first sub-buffer layer and a second sub-buffer layer, for example, the first sub-buffer layer may include silicon oxide with a thickness ranging from 500 Å to 1000 Å, and the second sub-buffer layer may include silicon nitride with a thickness ranging from 400 Å to 600 Å.

As mentioned earlier, a bottom-up transition from dense to sparse film densities can be achieved by step-by-step deposition. Taking a 3000 Å thick silicon oxide layer that can be used as a buffer layer as an example, we can deposit it in 3 depositions (e.g., a 1000 Å silicon oxide layer is formed per deposition) or 6 depositions (e. g., a 500 Å silicon oxide layer is formed per deposition) or more. The lowest layer is deposited with relatively low power, high temperature and other process parameters that are conducive to the formation of a dense film, and then the power is increased and the temperature is decreased in a gradient during the distribution of deposition to achieve the transition from dense film to sparse film densities.

Figure 5:
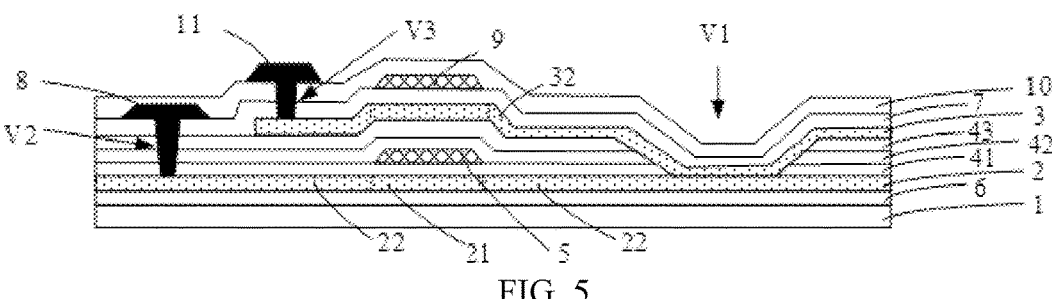
FIG. 5 is a schematic view of an array substrate according to an embodiment of the disclosure.

FIG. 5 shows a schematic view of an array substrate according to an embodiment of the disclosure. As shown in FIG. 5, in some embodiments, the array substrate may also include another buffer layer 6 between the substrate 1 and the first active layer 2, a third insulating layer 7 on the second active layer 3 away from the substrate 1, a first source/drain electrode 8 on the surface of the third insulating layer of 7 away from the substrate 1, a second via V2 in the first insulating layer 41, the second insulating layer 42, the buffer layer 43 and the third insulating layer 7, a second gate electrode 9 on a surface of the third insulating layer 7 away from the substrate 1, an interlayer dielectric layer 10 on a surface of the second gate electrode 9 away from the substrate 1, a second source/drain electrode 11 on a surface of the interlayer dielectric layer 10 away from the substrate 1, and a third via V3 in the interlayer dielectric layer 10 and the third insulating layer 7.

As shown in FIG. 5, the second via V2 and the first via V1 are located on different sides of the first gate electrode 5, the second via V2 arrives at the first active layer 2, the first source/drain electrode 8 extends into the second via V2 and is in contact with the first source/drain region. A third via V3 and the first via V1 are on different sides of the second gate electrode 9, the third via V3 arrives at the second active layer 3, the second source/drain electrode 11 extends into the third via V3 and contacts the second source/drain region 32 of the second active layer 3.

Figure 6:
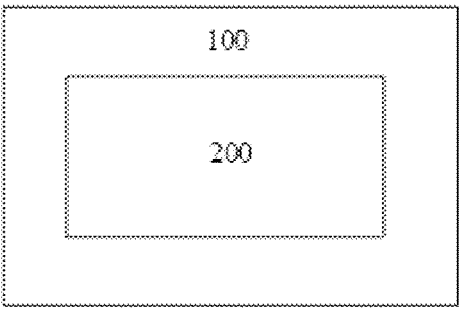
FIG. 6 is a schematic view of a display panel according to an embodiment of the disclosure.

FIG. 6 shows a schematic view of a display panel according to an embodiment of the disclosure. As shown in FIG. 6, the display panel 100 may include an array substrate 200. The array substrate 200 may include the array substrate shown in FIG. 2, FIG. 3A, FIG. 3B, FIG. 4, or FIG. 5.

FIG. 7 shows a schematic flowchart of a method for manufacturing an array substrate according to an embodiment of the disclosure. As shown in FIG. 7, a method for fabricating an array substrate according to an embodiment of the disclosure may include:

S1. forming a first active layer on the substrate;

S3. forming an intermediate layer on a side of the first active layer away from the substrate, wherein the intermediate layer has a first via arriving at the first active layer;

S5. forming a second active layer on the intermediate layer, wherein the second active layer includes a first sub-active layer, a second sub-active layer and a third sub-active layer, the first sub-active layer extends around the perimeter of the first via and in a direction away from the first via, the second sub-active layer covers a side wall of the first via, the third sub-active layer is at the bottom of the first via and covers a surface of the second active layer exposed by the first via and wherein the second active layer is continuous.

It is noted that to the expression that the second active layer is "continuous" means that the second active layer is formed by a one-step process.

As mentioned earlier, the inventors found that there were crystallization anomalies in the amorphous silicon at the lapped over-hole locations of the first active layer and the second active layer, which could affect the product yield. The method for manufacturing array substrates according to some embodiments of the present disclosure can avoid these problems and achieve a better product yield.

The first active layer may include polysilicon, and the second active layer may also include polysilicon. The array substrate according to some embodiments of the present invention can achieve a continuously adjustable angle $\alpha$ between s side wall of the first via and the first active layer, which can ensure that the tangent angle (i.e., i.e., the angle between the sidewall of the first via and the first active layer) $\alpha$ of the first via is gentler during the subsequent excimer laser annealing (ELA) process, thus providing better crystallization and ensuring a better lap between the first active layer and the second active layer. For example, the angle range between the sidewall of the first via and the first active layer can be continuously adjustable from 1° to 90°. For example, the angle between the side wall of the first via and the first active layer ranges from 45° to 90°.

In some embodiments, the intermediate layer 4 may include at least two sublayers. The densities of the at least two sub-intermediate layers may be decreasing along a direction from the first active layer to the second active layer. In some embodiments, as shown in FIG. 2, an angle $\alpha2$ between the sub-intermediate layer of the at least two sub-intermediate layers further away from the substrate and the first active layer may be less than an angle $\alpha1$ between the sub-intermediate layer of the at least two sub-intermediate layers closer to the substrate and the first active layer. In other embodiments, for example, as shown in FIG. 4, the angle between a sub-intermediate layer of the at least two sub-intermediate layers further away from the substrate and the first active layer is equal to the angle between a sub-intermediate layer of the at least two sub-intermediate layers closer to the substrate and the first active layer.

The angle between a sub-intermediate layer of the at least two sub-intermediate layers closest to the first active layer and the first active layer ranges from 1° to 90°, for example, from 45° to 90°. For example, the angle $\alpha1$ between the sub-intermediate layers of the at least two sub-intermediate layers closest to the first active layer and the first active layer may be 1°, 35°, 45°, 52°, 55°, 65°, 76°, 80°, 84° or 90°. The angles between remaining layers of the at least two sub-intermediate layers and the first active layer may also range from 1° to 90°, e.g., between 45° and 90°, for example, may be 1°, 35°, 45°, 52°, 55°, 65°, 76°, 80°, 84° or 90°.

In some embodiments, the first active layer includes a first channel region and a first source/drain region disposed on either side of the first channel region, and the second active layer includes a second channel region and a second source/drain region disposed on either side of the second channel region, and wherein the first source/drain region is connected to the second source/drain region through a first via.

FIGS. 8A-FIG. 8G are schematic views of a method for manufacturing an array substrate according to some embodiments of the disclosure. The method for fabricating an array substrate according to some embodiments of the disclosure will be further illustrated below in conjunction with FIGS. 8A-FIG. 8G and using the example that both the first active layer and the second active layer are polysilicon layers.

As shown in FIG. 8A, a method for fabricating an array substrate according to an embodiment of the disclosure may include forming a first active layer on a substrate. Specifically, another buffer layer 6 may be formed on the substrate 1, a first amorphous silicon layer 20 may be formed on another buffer layer 6, and then this first amorphous silicon layer may be annealed to convert the first amorphous silicon layer into a first polysilicon layer, followed by a first doping of the polysilicon layer to form a first polysilicon layer 2 that has been first doped.

As shown in FIG. 8B, a method for fabricating an array substrate according to an embodiment of the disclosure further includes forming a first insulating layer 41 on a side, away from the substrate 1, of the first polysilicon layer 2 that has been first doped, forming a first gate electrode 5 on a side of the first insulating layer 41 away from the substrate 1, using the first gate electrode 5 as a mask, performing a second doping (for example, heavy doping) on the first polysilicon layer that has been first doped, such that a first active layer 2 is formed. Wherein the doping concentration of the second doping is greater than the doping concentration of the first doping. Optionally, during the second doping, the portion of the first polysilicon layer that is in contact with the subsequently formed first via is also doped to ensure a better connection of the first active layer and the second active layer.

As shown in FIG. 8C, the method for fabricating an array substrate according to some embodiments of the disclosure may further include forming a second insulating layer 42 on a surface of the first gate electrode 5 away from the substrate 1, the second insulating layer 42 also covers a portion, exposed by the first gate electrode 5, of a surface of the first insulating layer 41 away from the substrate 1, and then forming a buffer layer 43 on the surface of the second insulating layer 42 away from the substrate 1. Then, a patterning process, such as etching, is performed to form the first via V1.

Therein, forming the first insulating layer, the second insulating layer and the buffer layer may include controlling the densities by controlling at least one of the deposition temperature and the deposition power. At least one of the first insulating layer, the second insulating layer, and the buffer layer may include at least two sublayers, wherein for two adjacent sublayers of the at least two sublayers, at least one of the deposition temperature and deposition power corresponding to the sublayer further away from the substrate is less than at least one of the deposition temperature and the deposition power corresponding to the sublayer closer to the substrate. This ensures a decreasing gradient in the denseness of the film from the first insulating layer to the second insulating layer and then to the buffer layer. The stacked film is then etched by a patterning process such as a dry etching process to form a first via with a gentler slope angle for better implementation of the subsequent ELA process and via doping process. For example, the angle between the sidewall of the first via and the first active layer can be continuously adjustable from 1° to 90°. For example, the angle between the sidewall of a via and the first active layer ranges from 45° to 90°. For example, the angle α can be 1°, 30°, 45°, 50°, 65°, 78°, 840 or 90°.

As mentioned earlier, a bottom-up transition from dense to sparse film density can be achieved by step-by-step deposition. Taking a 3000 Å thick silicon oxide layer that can be used as a buffer layer as an example, we can deposit it in 3 depositions (e.g., a 1000 Å silicon oxide layer is formed per deposition) or 6 depositions (e. g., a 500 Å silicon oxide layer is formed per deposition) or more. The lowest layer is deposited with relatively low power, high temperature and other process parameters that are conducive to the formation of a dense film, and then the power is increased and the temperature is decreased in a gradient during the distribution of deposition to achieve the transition from dense film to sparse film.

In some embodiments, the first insulating layer includes a first sub-insulating layer, the first sub-insulating layer may include silicon oxide SiO with a thickness ranging from 1000 Å to 1500 Å. In other embodiments, the first insulating layer may include a first sub-insulating layer and a second sub-insulating layer on a surface of the first sub-insulating layer away from the substrate, the first sub-insulating layer may include silicon oxide with a thickness ranging from of 500 Å to 1000 Å, and the second sub-insulating layer includes silicon nitride with a thickness ranging from 400 Å to 600 Å.

In some embodiments, the buffer layer may include a first sub-buffer layer, for example, the first sub-buffer layer may include silicon oxide with a thickness ranging from 3000 Å to 4000 Å. In other embodiments, the buffer layer may include a first sub-buffer layer and a second sub-buffer layer, for example, the first sub-buffer layer may include silicon oxide with a thickness ranging from 500 Å to 1000 Å, and the second sub-buffer layer may include silicon nitride with a thickness ranging from 400 Å to 600 Å.

Figure 8D:
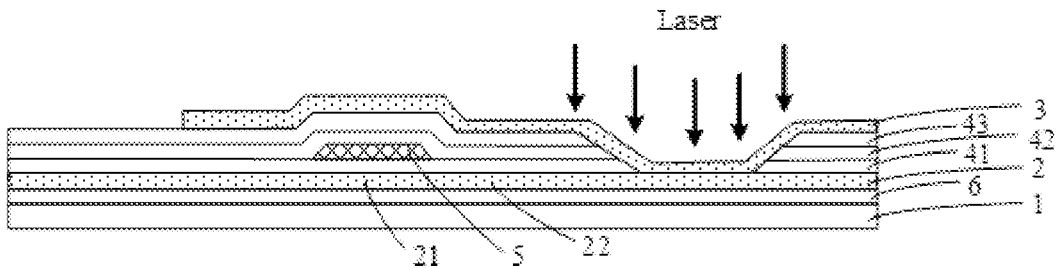

As shown in FIG. 8D, the method for fabricating an array substrate according to some embodiments of the disclosure may further include forming a second amorphous silicon layer on the buffer layer 43, annealing the second amorphous silicon layer to convert the second amorphous silicon layer to a second polycrystalline silicon layer, and performing a third doping on the second polycrystalline silicon layer to form a second polycrystalline silicon layer that has been third doped.

Figure 8E:
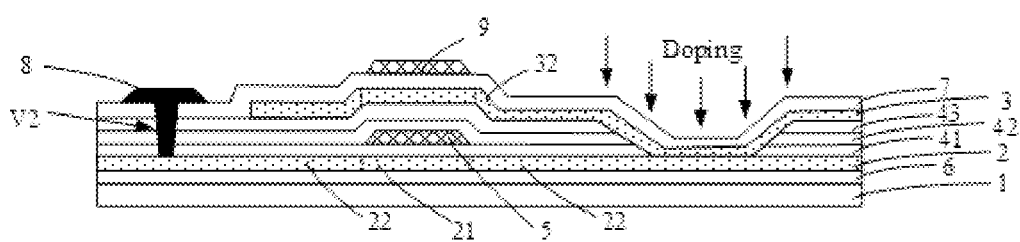

As shown in FIG. 8E, the method for fabricating an array substrate according to some embodiments of the disclosure may further include forming a third insulating layer 7 on the second polysilicon layer 2, forming a second gate electrode 9 on the third insulating layer 7, using the second gate electrode 9 as a mask, performing a fourth doping on the polysilicon layer that has been third doped to form the second active layer 2, wherein a doping concentration of the fourth doping is greater than a doping concentration of the third doping. The method also includes patterning the inter-layer dielectric layer 10, the third insulating layer 7, the first buffer layer 43, the second insulating layer 42 and the first insulating layer 41 to form a second via arriving at the first active layer.

Figure 10:
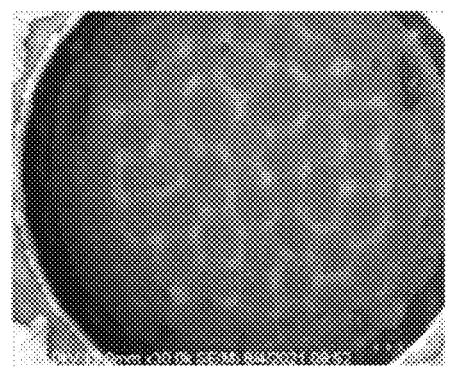
FIG. 10 is a local scanning electron microscope image of an array substrate according to an embodiment of the disclosure.

As shown in FIG. 8E, the fourth doping includes doping a portion of the second active layer disposed in the first via. A doping concentration of the fourth doping may be greater than a doping concentration of the second doping to allow better conductivity of the uncrystallized amorphous silicon (see, for example, region II of FIG. 3) after a crystallization process such as ELA, thus ensuring better contact between the first active layer and the second active layer at the first via of a bilayer LTPS structure, for example. FIG. 10 illustrates the SEM image of the array substrate obtained by such a method, which will be described in detail later.

Figure 8F:
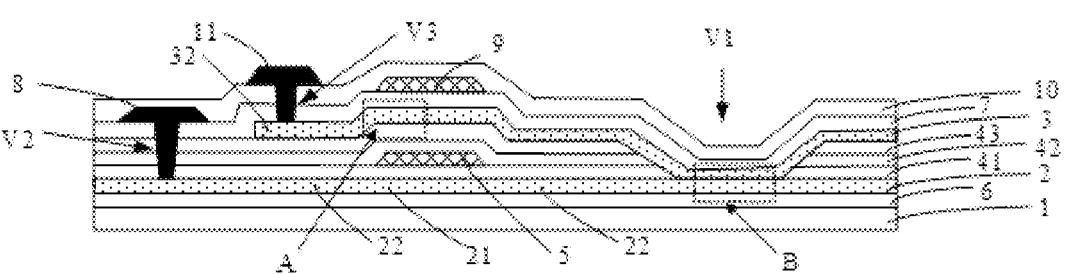

As shown in FIG. 8F, the method for fabricating an array substrate according to some embodiments of the disclosure may further include forming an interlayer dielectric layer 10 on a surface of the second gate electrode 9 away from the substrate 1 and on an exposed surface of the third insulating layer 7, forming a third via V3 in the interlayer dielectric layer 10 and the third insulating layer 7, forming a second source/drain electrode 11 on a surface of the interlayer dielectric layer 10 away from the substrate 1, wherein the second source/drain electrode 11 extends into the third via V3 and contacts with a second source/drain region 32 of the second active layer 3.

Figure 8G:
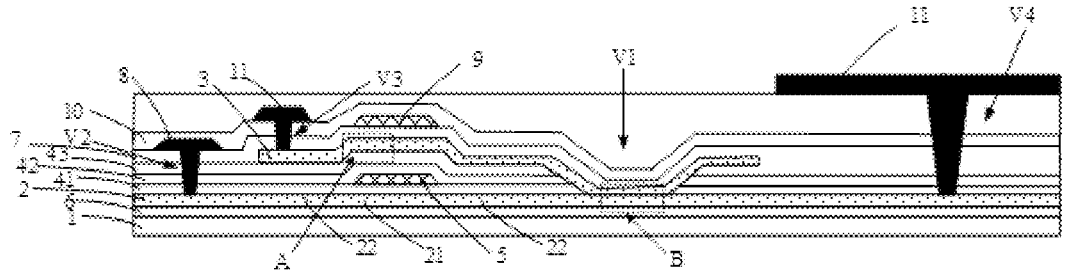

As shown in FIG. 8G, the method for manufacturing an array substrate according to some embodiments of the disclosure may further include forming a display unit 11' including a first electrode 11 on the interlayer dielectric layer 10 and forming a fourth via V4, wherein the fourth via V4 extends from the interlayer dielectric layer to the first active layer 2, the first electrode 11 is connected to the first active layer 2 through the fourth via V4, and wherein a projection of the first via V1 on the substrate 1 does not overlap with a projection of the fourth via V4 on the substrate 1.

Figure 9:
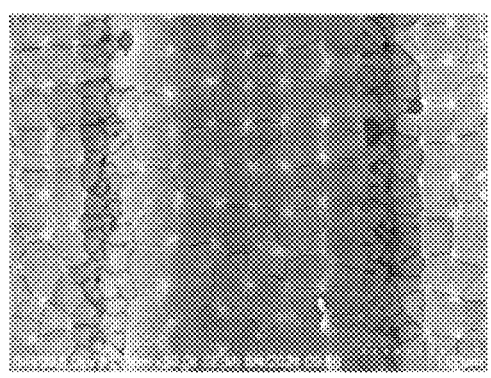
FIG. 9 is a local scanning electron micrograph of an array substrate according to an embodiment of the disclosure.

FIG. 9 shows a local scanning electron micrograph of an array substrate according to an embodiment of the disclosure. FIG. 9 illustrates a scanning electron microscope image of the second active layer above the first gate (see, for example, region A in 8F). As can be seen from FIG. 9, this portion of the active layer has good crystallinity.

FIG. 10 shows a local scanning electron microscope image of an array substrate according to an embodiment of the disclosure. FIG. 10 illustrates a scanning electron microscope image of a second active layer in a first via (see, for example, region B in 8F). The region II in FIG. 3 suffers from incomplete crystallization, which is significantly improved in FIG. 10. As shown in FIG. 10, the second active layer in the first via also has good crystallization.

The inventors further verified the doping effect on the active layer of some embodiments of the disclosure. Table 1 shows the doping effect of the second active layer (for example, a low-temperature polycrystal). In this case, the sheet resistance before annealing is the sheet resistance after the fourth doping and before annealing, and the resistance after annealing is the sheet resistance after the fourth doping and after annealing. The commercially available sheet resistance of the n+ a-Si film that can be used as a wire after heavy doping and becoming a conductor has a value of $2.0 \times 10^7$. As can be seen, the active layer of some embodiments of the disclosure can achieve the same order of magnitude level of conductivity as the commercially available n+ a-Si film after activation by the doping and injection annealing process.

TABLE 1

| Doping amount | Rs (Ω/Sheet), before annealing | Rs (Ω/Sheet), after annealing (RTA 600° C./200 s |
|---|---|---|
| B ($5 \times 10^{15}$) | $5.6 \times 10^7$ | $3.0 \times 10^7$ |
| P ($5 \times 10^{15}$) | $7.0 \times 10^8$ | $3.0 \times 10^7$ |

Figure 11:
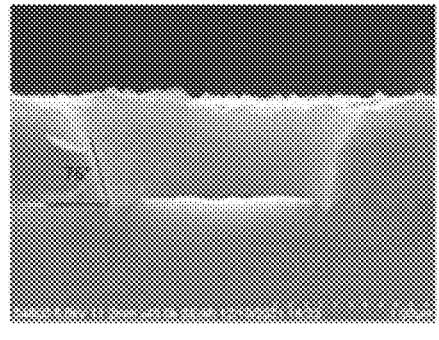
FIG. 11 is a local scanning electron microscope image of an array substrate according to an embodiment of the disclosure.
Figure 11:
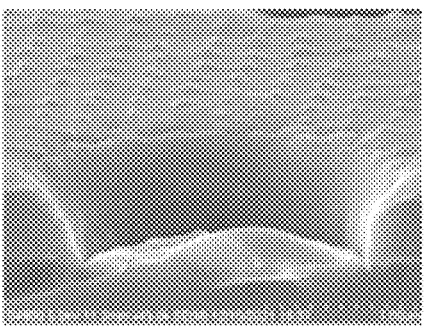

FIG. 11 shows a local scanning electron micrograph of an array substrate according to an embodiment of the disclosure. In FIG. 11, the angle between the first via and the first active layer is 76°. In carrying out the patterning process shown in FIG. 8C, it is possible to use a first atmosphere of CF4 and O2 and then a second atmosphere of O2, and the ratio of the duration of the first atmosphere to the second atmosphere can be about 4:1, and obtain the first via structure shown in FIG. 11.

Figure 12:
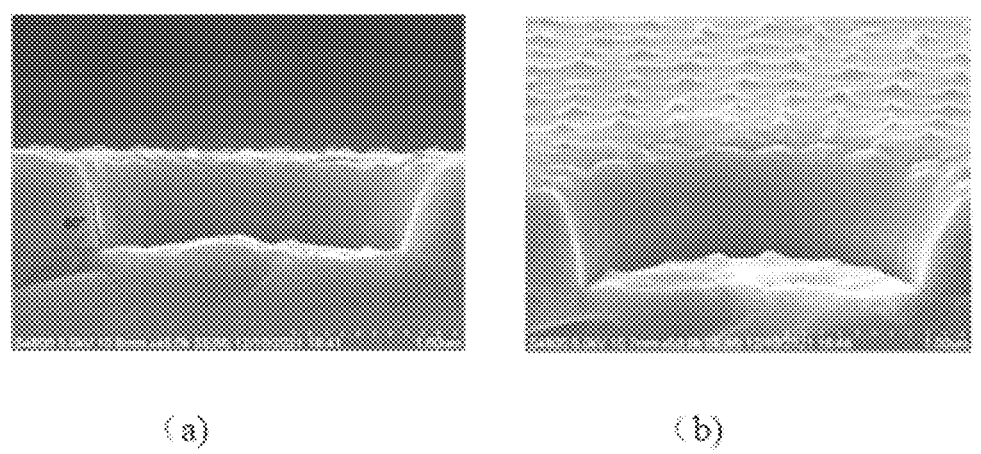
FIG. 12 is a local scanning electron microscope image of an array substrate according to an embodiment of the disclosure.

FIG. 12 shows a local scanning electron micrograph of an array substrate according to an embodiment of the disclosure. In FIG. 12, the angle between the first via and the first active layer is 80°. In performing the patterning process shown in FIG. 8C, a first atmosphere of CF4 and O2 followed by a second atmosphere of CHF3, Ar and H2, then followed by a third atmosphere of O2 can be used, and the ratio of the duration of the first atmosphere, the second atmosphere and the third atmosphere can be about 6:1:1.5, and the first via structure shown in FIG. 12 can be obtained.

Figure 13:
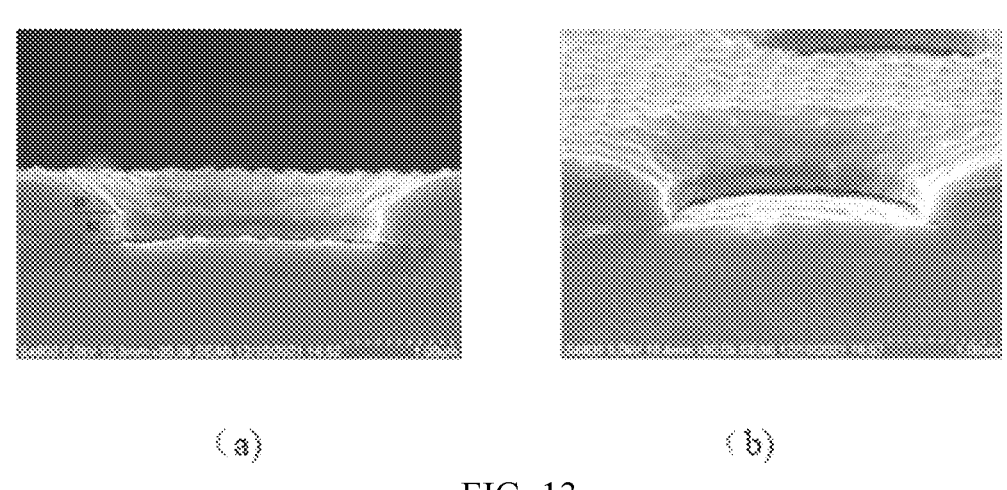
FIG. 13 is a local scanning electron microscope image of an array substrate according to an embodiment of the disclosure.

FIG. 13 shows a local scanning electron micrograph of an array substrate according to an embodiment of the disclosure. In FIG. 13, the first via may include a lower portion closer to the substrate and an upper portion further away from the substrate. As shown in FIG. 12, an angle of the lower portion of the first via between the first active layer (i.e., the angle between the sublayer of the intermediate layer closest to the first active layer and the first active layer) is 82°, and an angle between the upper portion of the first via and the first active layer (i.e., the angle between the sublayer of the intermediate layer furthest from the first active layer and the first active layer) is 35°. In carrying out the patterning process shown in FIG. 8C, it is possible to use a first atmosphere of SF6 and O2, followed by a second atmosphere of O2, and the ratio of the duration of the first atmosphere and the second atmosphere can be about 5:1, the first via structure shown in FIG. 13 can be obtained.

Figure 14:
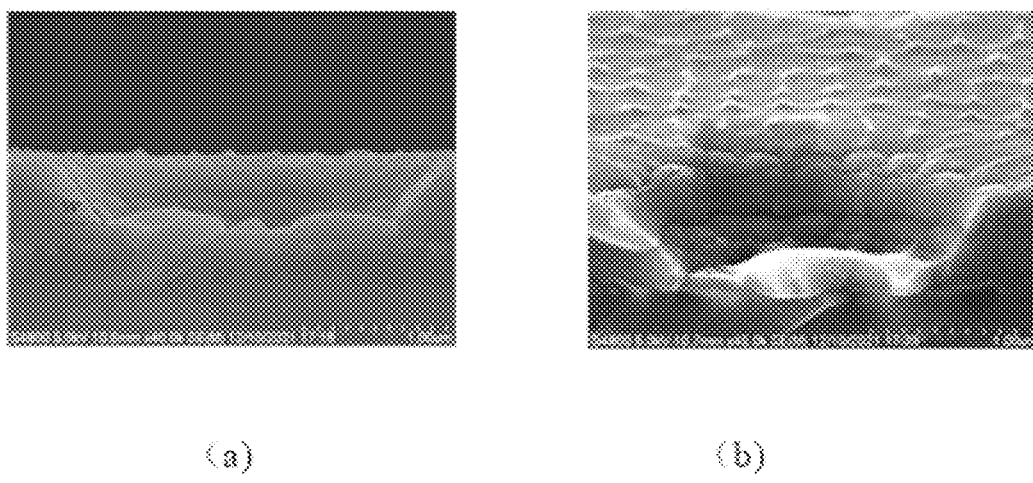
FIG. 14 is a local scanning electron microscope image of an array substrate according to an embodiment of the disclosure.

FIG. 14 shows a local scanning electron micrograph of an array substrate according to an embodiment of the disclosure. In FIG. 14, the angle between the first via and the first active layer is 55°. In performing the patterning process shown in FIG. 8C, a first atmosphere of SF6 and O2, followed by a second atmosphere of CF4 and O2, then followed by a third atmosphere of CHF6, Ar and O2, later followed by a fourth atmosphere of O2, can be used, and the ratio of the duration of the first atmosphere, the second atmosphere, the third atmosphere and the fourth atmosphere can be about 2:1:1:1, the first via structure shown in FIG. 14 can be obtained.

Figure 15:
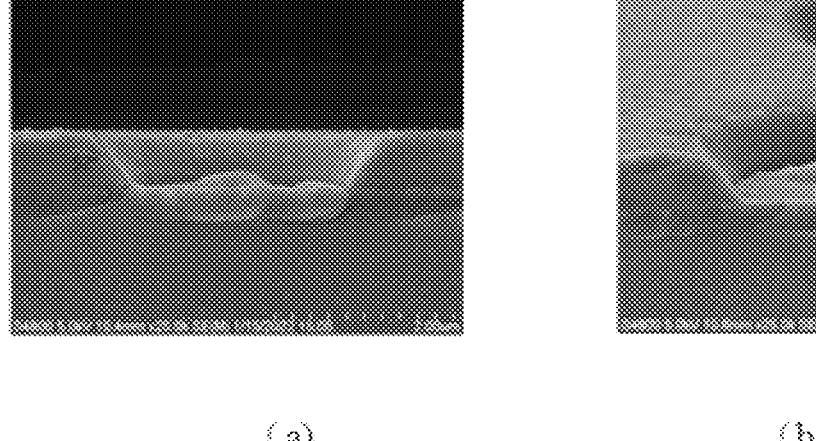
FIG. 15 is a local scanning electron microscope image of an array substrate according to an embodiment of the disclosure.

FIG. 15 shows a local scanning electron micrograph of an array substrate according to an embodiment of the disclosure. In FIG. 15, the angle between the first via and the first active layer is 52°. In performing the patterning process shown in FIG. 8C, it is possible to use a first atmosphere of O2, followed by a second atmosphere of CF4 and O2, then followed by a third atmosphere of CHF3, Ar and H2, later followed by a fourth atmosphere of O2, and the ratio of the duration of the first atmosphere, the second atmosphere, the third atmosphere and the fourth atmosphere can be about 1:6:2:1, the first via structure shown in FIG. 15 can be obtained.

Figure 16:
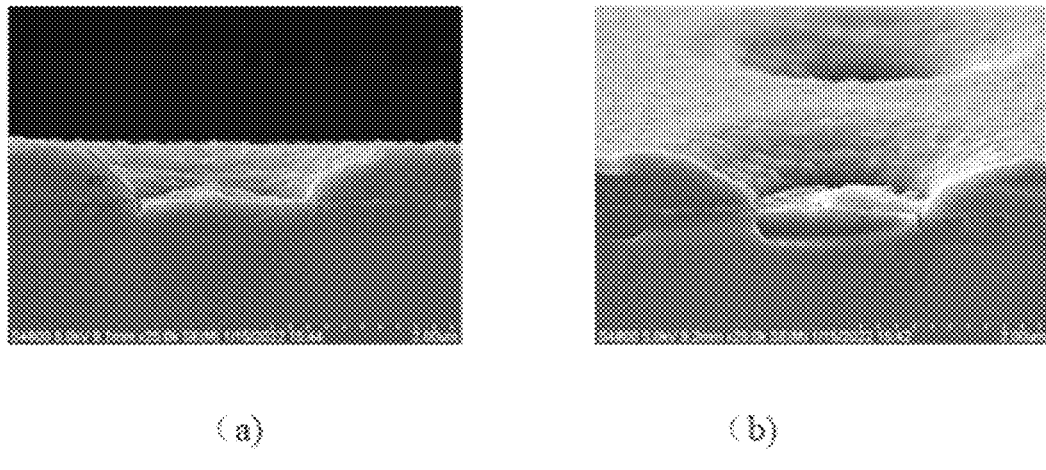
FIG. 16 is a local scanning electron microscope image of an array substrate according to an embodiment of the disclosure.

FIG. 16 shows a local scanning electron micrograph of an array substrate according to an embodiment of the disclosure. In FIG. 16, the angle between the first via and the first active layer is 45°. In performing the patterning process shown in FIG. 8C, a first atmosphere of O2, followed by a second atmosphere of SF6/O2, then followed by a third atmosphere of CHF3, Ar and H2, later followed by a fourth atmosphere of O2, can be used, and the ratio of the duration of the first atmosphere, the second atmosphere, the third atmosphere and the fourth atmosphere can be about 1:14:4: 3, the first via structure shown in FIG. 16 can be obtained.

As seen in FIGS. 11-FIG. 16, the array substrate according to an embodiment of the present invention can achieve a continuously adjustable angle α between the sidewall of the first via and the first active layer, which can ensure that the tangent angle α of the first via (i.e., the angle between the sidewall of the first via and the first active layer) is relatively gentler during the subsequent excimer laser annealing (ELA) process. This provides a better crystallization effect and ensures a better lap between the first active layer and the second active layer.

The specific embodiments have been described, and are not intended to limit the scope of the disclosure. In fact, the novel embodiments described herein can be implemented in a variety of other forms. In addition, various omissions, substitutions, and changes in the form of the embodiments described herein may be made without departing from the spirit of the disclosure. The following claims and their equivalents are intended to cover such forms or modifications that fall within the scope and spirit of the disclosure.

What is claimed is:

1. An array substrate comprising:
a substrate;
a first active layer on the substrate;
a second active layer on a side of the first active layer away from the substrate; and
an intermediate layer between the first active layer and the second active layer, wherein the intermediate layer comprises a first via arriving at the first active layer, wherein the second active layer comprises a first sub-active layer, a second sub-active layer and a third sub-active layer, the first sub-active layer extending around a perimeter of the first via and in a direction away from the first via, the second sub-active layer covering a side wall of the first via, the third sub-active layer being at a bottom of the first via and covering a portion of a surface of the first active layer exposed by the first via, wherein the second active layer is continuous, wherein the second active layer covers the side wall of the first via and the bottom of the first via, but does not fill the first via, and
wherein the first active layer comprises polysilicon, and the second active layer comprises polysilicon.

2. The array substrate according to claim 1, wherein the intermediate layer comprises at least two sub-intermediate layers, and wherein an angle between a side surface, facing the first via, of a sub-intermediate layer of the at least two sub-intermediate layers further away from the substrate and the first active layer is smaller than an angle between a side surface, facing the first via, of a sub-intermediate layer of the at least two sub-intermediate layers closer to the substrate and the first active layer.

3. The array substrate according to claim 2, wherein an angle between a side surface, facing the first via, of a sub-intermediate layer of the at least two sub-intermediate layers closest to the first active layer and the first active layer ranges from 1° to 90°.

4. The array substrate according to claim 3, wherein the angle between a side surface, facing the first via, of a sub-intermediate layer of the at least two sub-intermediate layers closest to the first active layer and the first active layer ranges from 45° to 90°.

5. The array substrate according to claim 1, wherein the intermediate layer comprises at least two sub-intermediate layers, and wherein an angle between a side surface, facing the first via, of a sub-intermediate layer of the at least two sub-intermediate layers further away from the substrate and the first active layer is equal to an angle between a side surface, facing the first via, of a sub-intermediate layer of the at least two sub-intermediate layers closer to the substrate and the first active layer.

6. The array substrate according to claim 1, wherein the first active layer comprises a first channel region and a first source/drain region disposed on either side of the first channel region, and wherein the second active layer comprises a second channel region and a second source/drain region disposed on either side of the second channel region, and wherein the first source/drain region is connected to the second source/drain region through the first via.

7. The array substrate according to claim 6, further comprising a first gate electrode on the first active layer, wherein the intermediate layer comprises:
a first insulating layer between the first active layer and the first gate electrode;
a second insulating layer on a surface of the first gate electrode away from the substrate, wherein the second insulating layer further covers a portion, exposed by the first gate electrode, of a surface of the first insulating layer away from the substrate; and
a buffer layer on a surface of the second insulating layer away from the substrate.

8. The array substrate according to claim 7, wherein at least one of the first insulating layer, the second insulating layer and the buffer layer comprises at least two sublayers, the at least two sublayers having decreasing densities in a direction from the first active layer to the second active layer.

9. The array substrate according to claim 7, wherein
the first insulating layer satisfies one of the following:
the first insulating layer comprises a first sub-insulating layer, or
the first insulating layer comprises a first sub-insulating layer and a second sub-insulating layer on a surface of the first sub-insulating layer away from the substrate;
and wherein the buffer layer satisfies one of the following:
the buffer layer comprises a first sub-buffer layer, or
the buffer layer comprises a first sub-buffer layer and a second sub-buffer layer on a surface of the first sub-buffer layer of the silicon nitride away from the substrate.

10. The array substrate according to claim 9, wherein the second insulating layer comprises silicon nitride with a thickness ranging from 800 Å to 2000 Å;
in case the first insulating layer comprises a first sub-insulating layer, the first sub-insulating layer comprises silicon oxide with a thickness ranging from 1000 Å to 1500 Å;
in case the first insulating layer comprises the first sub-insulating layer and the second sub-insulating layer, the first sub-insulating layer comprises silicon oxide with a thickness ranging from 500 Å to 1000 Å, and the second sub-insulating layer comprises silicon nitride with a thickness ranging from 400 Å to 600 Å; and wherein
in case the buffer layer comprises a first sub-buffer layer, the first sub-buffer layer comprises silicon oxide with a thickness ranging from 3000 Å to 4000 Å, and
in case the buffer layer comprises a first sub-buffer layer and the second sub-buffer layer, the first sub-buffer layer comprises silicon oxide with a thickness ranging from 500 Å to 1000 Å, and the second sub-buffer layer comprises silicon nitride with a thickness ranging from 400 Å to 600 Å.

11. The array substrate according to claim 7, further comprising:

another buffer layer between the substrate and the first active layer;

a third insulating layer on a surface of the second active layer away from the substrate;

a first source/drain electrode on a surface of the third insulating layer away from the substrate;

a second via in the first insulating layer, the second insulating layer, the buffer layer and the third insulating layer, the second via and the first via being on different sides of the first gate electrode, the second via arriving at the first active layer, the first source/drain electrode extending into the second via and in contact with the first source/drain region;

a second gate electrode on a surface of the third insulating layer away from the substrate;

an interlayer dielectric layer on a surface of the second gate electrode away from the substrate;

a second source/drain electrode on a surface of the inter-layer dielectric layer away from the substrate; and a third via in the interlayer dielectric layer and the third insulating layer, the third via and the first via being on different sides of the second gate electrode, the third via arriving at the second active layer, the second source/drain electrode extending into the third via and con-tacting the second source/drain region of the second active layer.

12. The array substrate according to claim 11, further comprising a display unit and a fourth via on the interlayer dielectric layer, wherein the display unit comprises a first electrode, the fourth via extending from the interlayer dielectric layer to the first active layer, the first electrode being connected to the first active layer through the fourth via, and wherein a projection of the first via on the substrate does not overlap with a projection of the fourth via on the substrate.

13. A display panel comprising an array substrate according to claim 1.

14. A method for manufacturing an array substrate, com-prising:

forming a first active layer on a substrate;

forming an intermediate layer on a side of the first active layer away from the substrate, wherein the intermediate layer has a first via arriving at the first active layer; and forming a second active layer on the intermediate layer, wherein the second active layer comprises a first sub-active layer, a second sub-active layer and a third sub-active layer, the first sub-active layer extending around a perimeter of the first via and in a direction away from the first via, the second sub-active layer covering a side wall of the first via, the third sub-active layer being at a bottom of the first via and covering a portion of a surface of the first active layer exposed by the first via, wherein the second active layer is con-tinuous, wherein the second active layer covers the side wall of the first via and the bottom of the first via, but does not fill the first via, and wherein the first active layer comprises polysilicon, and wherein the second active layer comprises polysilicon.

15. The method for fabricating an array substrate accord-ing to claim 14, wherein the intermediate layer comprises at least two sub-intermediate layers, and wherein an angle between a side surface, facing the first via, of a sub-intermediate layer of the at least two sub-intermediate layers further away from the substrate and the first active layer is smaller than an angle between a side surface, facing the first via, of a sub-intermediate layer of the at least two sub-intermediate layers closer to the substrate and the first active layer.

16. The method for manufacturing an array substrate according to claim 14, wherein the intermediate layer com-prises at least two sub-intermediate layers, and wherein an angle between a side surface, facing the first via, of a sub-intermediate layer of the at least two sub-intermediate layers further away from the substrate and the first active layer is equal to an angle between a side surface, facing the first via, of a sub-intermediate layer of the at least two sub-intermediate layers closer to the substrate and the first active layer.

17. The method for fabricating an array substrate accord-ing to claim 14, wherein the first active layer comprises a first channel region and a first source/drain region disposed on either side of the first channel region, and wherein the second active layer comprises a second channel region and a second source/drain region disposed on either side of the second channel region, and wherein the first source/drain region is connected to the second source/drain region through the first via.

18. The method for manufacturing an array substrate according to claim 17, further comprising forming a first gate electrode on the first active layer, wherein forming the intermediate layer comprises: form-ing a first insulating layer between the first active layer and the first gate electrode;

forming a second insulating layer on a surface of the first gate electrode away from the substrate, wherein the second insulating layer further covers a portion, exposed by the first gate electrode, of a surface of the first insulating layer away from the substrate; and forming a buffer layer on a surface of the second insu-lating layer away from the substrate.

* * * * *